US006356736B2

(12) United States Patent
Tomasz et al.

(10) Patent No.: US 6,356,736 B2
(45) Date of Patent: *Mar. 12, 2002

(54) DIRECT-CONVERSION TUNER INTEGRATED CIRCUIT FOR DIRECT BROADCAST SATELLITE TELEVISION

(75) Inventors: Martin Tomasz, San Francisco, CA (US); James W. H. Marsh, Sherwood, OR (US)

(73) Assignee: Maxim Integrated Products, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/140,365

(22) Filed: Aug. 26, 1998

Related U.S. Application Data

(63) Continuation-in-part of application No. 08/808,400, filed on Feb. 28, 1997, now Pat. No. 6,031,878.

(51) Int. Cl.[7] .................................................. H04B 1/16
(52) U.S. Cl. ................... 455/3.02; 455/251.1; 455/318; 455/324; 455/260; 375/345
(58) Field of Search .............................. 455/3.2, 232.1, 455/234.1, 234.2, 241.1, 245.1, 251.1, 260, 313, 318, 324, 333, 339, 340, 3.02, 255, 259; 375/316, 345; 348/729, 731

(56) References Cited

U.S. PATENT DOCUMENTS

| 4,408,351 A | | 10/1983 | Maurer et al. ............... 455/206 |
|---|---|---|---|
| 4,464,770 A | | 8/1984 | Maurer et al. ............... 375/119 |
| 4,476,585 A | | 10/1984 | Reed ............................ 455/207 |
| 4,777,657 A | | 10/1988 | Gillaspie |
| 5,003,621 A | | 3/1991 | Gailus ......................... 455/209 |
| 5,179,731 A | * | 1/1993 | Trankle ........................ 455/324 |
| 5,187,809 A | | 2/1993 | Rich et al. ................... 455/234 |
| 5,323,425 A | * | 6/1994 | Colamonico et al. ..... 455/234.1 |
| 5,325,401 A | | 6/1994 | Halik et al. ..................... 375/83 |
| 5,398,002 A | | 3/1995 | Bang ............................ 329/302 |
| 5,446,762 A | | 8/1995 | Ohba et al. .................. 375/324 |
| 5,448,774 A | | 9/1995 | Yokozaki et al. ............ 455/343 |
| 5,521,548 A | | 5/1996 | Sugawara ..................... 329/306 |
| 5,528,633 A | | 6/1996 | Halik et al. .................. 375/326 |
| 5,600,672 A | | 2/1997 | Oshima et al. .............. 375/219 |
| 5,606,731 A | * | 2/1997 | Pasc et al. .................... 455/324 |
| 5,649,312 A | | 7/1997 | Kennan ........................ 455/333 |
| 5,697,093 A | * | 12/1997 | Cusdin et al. ............... 455/324 |
| 5,745,531 A | | 4/1998 | Sawahashi et al. .......... 375/345 |
| 5,790,202 A | | 8/1998 | Kummer et al. ............. 348/553 |
| 5,937,341 A | * | 10/1999 | Suominen .................... 455/324 |
| 5,999,793 A | * | 12/1999 | Ben-Efraim et al. ......... 455/3.2 |
| 6,031,878 A | * | 2/2000 | Tomasz et al. ............... 455/3.2 |

FOREIGN PATENT DOCUMENTS

| EP | 0 739 090 | 10/1996 |
|---|---|---|
| WO | WO96/39745 | 12/1996 |

OTHER PUBLICATIONS

Schultes, Gerhard, et al., A New Incoherent Direct Conversion Receiver;, 40th IEEE Vehicular Technology Conference, May 6, 1990–May 9, 1990, pp. 668–674, Orlando, Florida.

* cited by examiner

Primary Examiner—Lester G. Kincaid
(74) Attorney, Agent, or Firm—Blakely, Sokoloff, Taylor & Zafman LLP

(57) ABSTRACT

A converter for the direct down-conversion of direct broadcast satellite signals such as those used for digital television. The direct broadcast satellite signal received from the satellite dish is amplified and then downshifted within the Low Noise Block (LNB), a subsystem contained with the satellite dish assembly, to a predetermined frequency band, typically in the L-band in the range 950 MHz to 2150 MHz. The signal is then sent via a coaxial cable to the set-top box unit located indoors, and there directly converted from the received frequency to baseband, in one embodiment by a single integrated circuit comprising a variable gain amplifier (VGA), frequency synthesizer, a quadrature generator and a plurality of mixers.

25 Claims, 7 Drawing Sheets

DIRECT-CONVERSION TUNER INTEGRATED CIRCUIT FOR DIRECT BROADCAST SATELLITE TELEVISION

CROSS-REFERENCES TO RELATED APPLICATIONS

This is a Continuation-in-Part Ser. No. 08/808,400 U.S. Pat. No. 6,031,878, which was filed Feb. 28, 1997 and is owned by Assignee of the present Application.

BACKGROUND OF THE INVENTION

1. Field of the Invention

The present invention relates to the field of satellite receivers, and more specifically to satellite to home direct broadcast receiver systems for reception of digitally modulated broadcast information.

2. Prior Art

Digital television is digitally modulated when broadcast over satellite systems using phase shift keyed modulation schemes. The signals are typically received at Ku-band or C-band via a satellite dish antenna. The signals are first amplified and then downshifted to a predetermined frequency band, typically in the L-band, in the range 950 MHz to 2150 MHz. This function is performed within the Low Noise Block (LNB), a subsystem contained within the satellite dish assembly. The signal is then sent via a coaxial cable to the set-top box unit located indoors. In the prior art, the signal received at the set-top box is downshifted to a predetermined intermediate frequency for amplification, bandpass filtering to eliminate adjacent channels and other functions such as automatic gain control, etc., with a subsequent or second down conversion to baseband and recovery of the PSK (phase shift keyed) modulated data.

A specific representative system for reception of the direct broadcast satellite (DBS) signal and extraction of the digital data in the signal is shown in FIG. 1. The signal delivered to the set-top box through cable 20, typically in the frequency range of 950 MHz to 2150 MHz, is amplified through one or more amplifiers 22, 24 and/or 26 and passed through an image filter 28 to an L-band tuner. Typically, gain control is provided in one or more amplifiers amplifying the received signal, such as by way of a variable gain amplifier 24 or a fixed gain amplifier 26 operating into a variable resistive attenuator 30.

The L-band tuner, controlled by external voltage controlled oscillator (VCO) 32, in turn referenced to a crystal controlled phase locked loop 34, downshifts the received signal by mixer 36 to the intermediate frequency, with the signal then passing through a surface acoustic wave (SAW) filter 38 to isolate the channel of interest. This filter is a fixed bandpass filter, the channel falling within the bandpass of the SAW filter 38 being selected by the specific frequency chosen by the phase locked loop 34 to determine the amount of downshifting to put the desired channel within the bandpass window of the SAW filter 38.

The output of the SAW filter 38 is then passed to a MAX2101 integrated circuit manufactured by Maxim Integrated Products, Inc., assignee of the present invention. The MAX2101 is controlled by a phase locked loop 40 and tank circuit 42 to mix the output of the SAW filter 38 with in-phase and quadrature components of the output of the tank circuit 42 by mixers 44 and 46 to provide in-phase (I) and quadrature (Q) components of the signal at base band. The I and Q signals are passed through low pass filter 48 and then converted to digital form by analog to digital converters 50 for demodulation by a digital signal processor (DSP) 52, which also typically provides an automatic gain control (AGC) signal to control the gain of one or more amplifiers in the system so that the amplitude of the digitized I and Q signals received by the DSP 52 are as expected.

Another example of the use of an intermediate frequency may be found in U.S. Pat. No. 5,325,401. The practice of shifting a received frequency band, first to an intermediate frequency for such purposes as further amplification, automatic gain control, station or channel isolation, etc., is an old practice dating back to the early days of radio. It has the advantage of requiring minimal tunable components and of making each channel or station have substantially identical characteristics at both the intermediate frequency and at baseband. However, it has the disadvantage of complexity in the number and nature of components required.

BRIEF SUMMARY OF THE INVENTION

A converter for the direct down-conversion of direct broadcast satellite signals such as those used for digital television. The direct broadcast satellite signal received from the satellite dish is amplified and then downshifted within the Low Noise Block (LNB), a subsystem contained with the satellite dish assembly, to a predetermined frequency band, typically in the L-band in the range 950 MHz to 2150 MHz. The signal is then sent via a coaxial cable to the set-top box unit located indoors, and there directly converted from the received frequency to baseband, in the preferred embodiment by a single integrated circuit, which may include a variable gain amplifier to control the signal levels presented to the mixers. Use of variable gain amplifiers at baseband for refinement of gain control, generation of closely controlled inphase and quadrature components of the down-converting mixers and offset compensation provides baseband inphase and quadrature components of sufficient quality for data recovery using conventional techniques.

Illustrative embodiments are disclosed.

BRIEF DESCRIPTION OF THE DRAWINGS

The features and advantages of the present invention will become apparent from the following detailed description of the present invention in which.

DETAILED DESCRIPTION OF THE INVENTION

In accordance with the present invention, the DBS signal delivered to the set-top box is directly converted from the received frequency to baseband, preferably by a single integrated circuit, so as to eliminate many components required or at least used in prior art systems to obtain and process the signal in intermediate frequency form and then shift to baseband.

Figure 2:
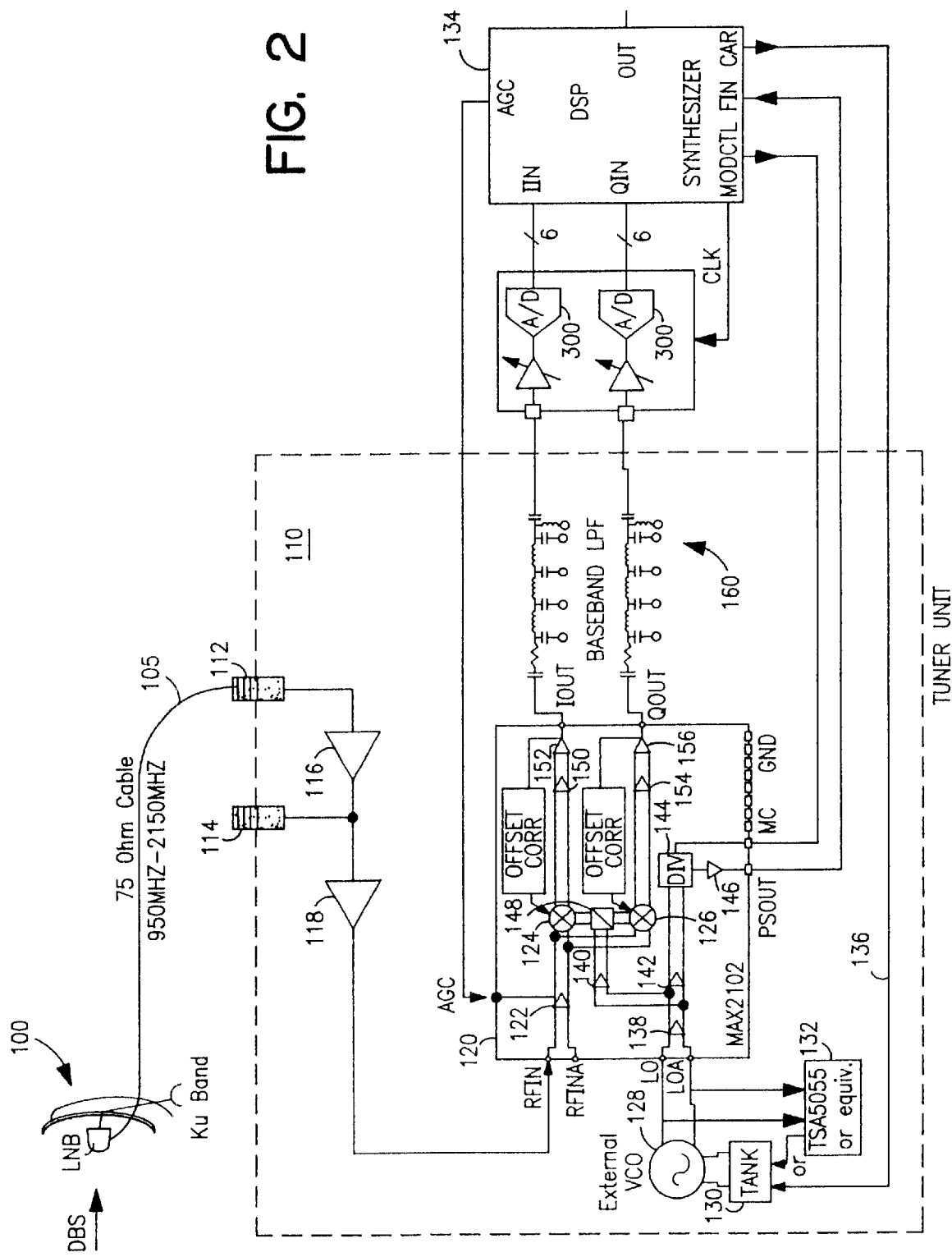
FIG. 2 is a diagram of an exemplary embodiment of the present invention.

Now referring to FIG. 2, a diagram of an embodiment of the present invention may be seen. The direct broadcast satellite (DBS) signal received from a satellite dish 100 is amplified and then downshifted within the Low Noise Block (LNB), a subsystem contained within the satellite dish assembly, to a predetermined frequency band, typically in the L-band in the range 950 megahertz (MHz) to 2150 MHz. The signal is then sent via a 75 ohm coaxial cable 105 to a set-top box unit located indoors. Typically, the set-top box includes a tuner unit 110 having an input connector 112 for receiving the signal on cable 105, and an output connector 114 which may be used for coupling the received signal to a second set top box, if needed. The input connector 112 is typically coupled to the output connector 114 through a buffer or fixed gain amplifier 116 as shown, or alternatively may be directly connected thereto if desired. It is contemplated that further amplification of the signal is provided by an additional amplifier 118, shown in FIG. 2 as a fixed gain amplifier, though the same may be provided with some degree of automatic gain control, either through use of a variable gain amplifier or a variable resistive attenuator coupled to the amplifier 118.

The signal from the amplifier 118 is provided to the integrated circuit 120 of the present invention. The integrated circuit 120 includes a variable gain amplifier 122, more fully described in detail later herein, which provides a wide range of automatic gain control and high linearity to provide acceptably low cross-talk between channels in the output thereof. The output of the amplifier 122 is a broadband output which contains, in this embodiment, all the channels in the 950 MHz to 2150 MHz DBS signal bandwidth.

The output of amplifier 122 is applied to mixers 124 and 126. The other input to the mixers is derived from an external voltage controlled oscillator (VCO) 128 referenced to an inductor-based tank circuit 130. The tank circuit 130, in turn, may be controlled either by the variable, crystal controlled phase locked loop (PLL) unit 132, or by a feedback voltage output (CAR) signal from the digital signal processor 134 along signal line 136. In the case of the use of the crystal controlled PLL unit 132 (such as part number TSA5055 manufactured by Philips, or an equivalent), the output of the VCO 128 is fed back, divided down by the ratio of the expected carrier frequency of the desired channel to the frequency of the crystal oscillator and then compared to the crystal oscillator frequency. The deviation in the external VCO frequency is used to control the tank circuit 130 to readjust the output frequency of the VCO 128.

The output of the mixers 124 and 126 will be the sum and the difference frequencies between the received signal and the output of the VCO 128. The sum frequencies are of course easily filtered out. Because the local selectable frequency oscillator will have selectable frequencies close to the carrier frequency of each of the channels in the received signal, but not identical thereto, the selected channel will generate difference frequencies slightly shifted from the original signal for that channel. The amount of shift is relatively low, however, with the guard bands between channels allowing the signals from adjacent channels to be filtered out by a fixed band, low pass filter. Also, typical DSP demodulation techniques allow recovery of the data, and carrier if desired, when the reference frequency for demodulation is not exactly equal to the modulation.

In the case of control of the tank circuit 130 by the CAR signal from the DSP 134, the external VCO 128 may be controlled to at least on average have the same frequency as the selected channel carrier, and as pointed out before, reasonable deviations in frequency can be tolerated by the DSP demodulator.

In any event, the output of the VCO 128 is applied to amplifier 138 in the integrated circuit 120, which in turn is further amplified by amplifiers 140 and 142. The output of amplifier 142 is divided down by divider 144 and buffered by amplifier 146 to be provided as a prescaler output PSOUT, with the dividing ratio being controlled by a mode control signal MODCTL from the digital signal processor 134. The output of amplifier 140, on the other hand, is applied to quadrature generator 148 which generates 0° and 90° (orthogonal) components of the voltage controlled oscillator output, as shall be subsequently described in greater detail. While the design of quadrature generators such as quadrature generator 148 is well known in the prior art, closely controlled performance of the quadrature generator over a very wide band is very important to the successful performance of the present invention. In this embodiment, the quadrature generator 148 (and following amplifiers) is designed to provide less than 0.5 dB of gain mismatch and less than 3° of phase error with respect to the ideal quadrature signal over the entire range of 950 MHz to 2150 MHz.

Figure 3:
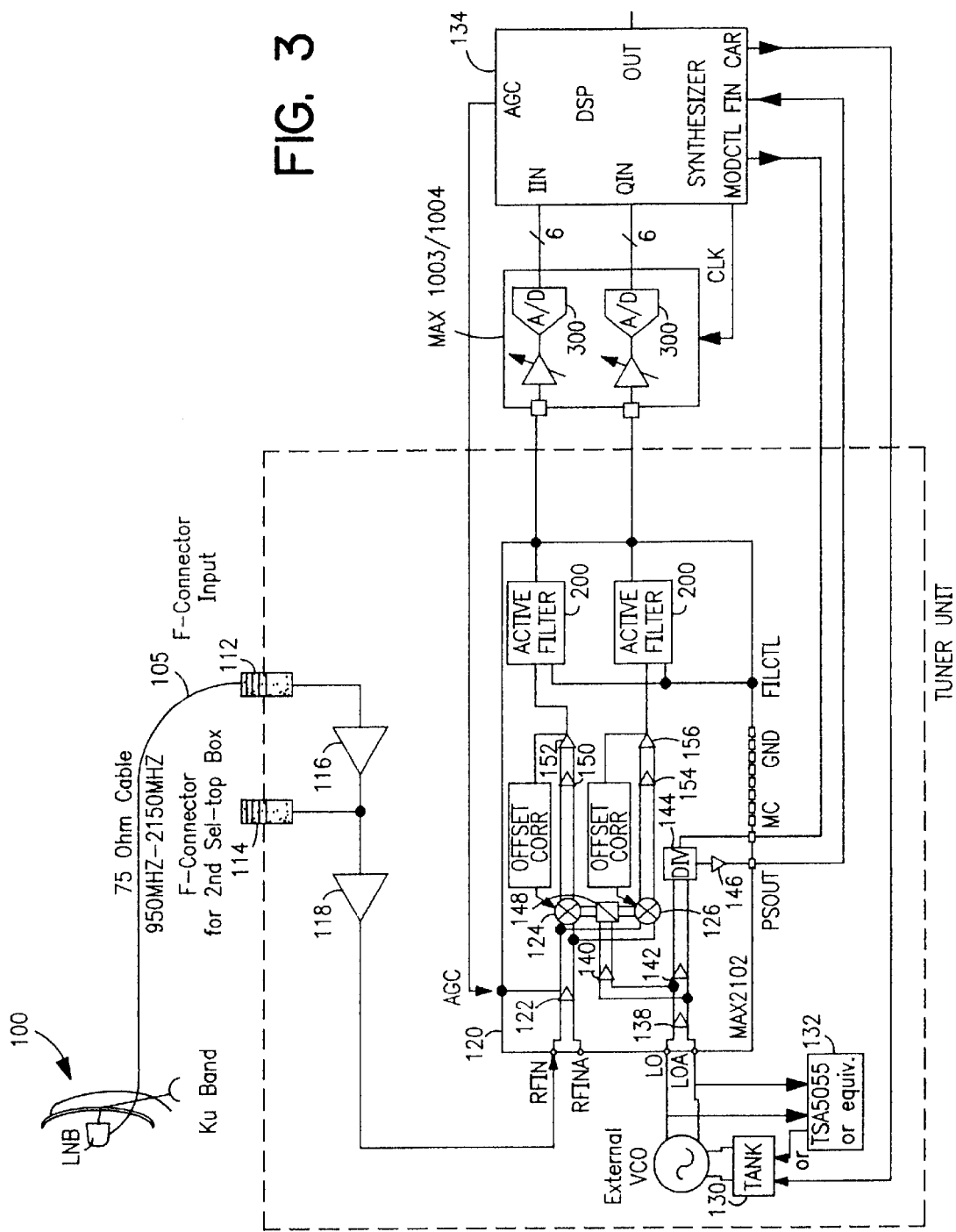
FIG. 3 is an exemplary alternate embodiment illustrating the incorporation of active filters as part of the integrated circuit.

The outputs of mixers 124 and 126 are applied to amplifiers 150 and 152, and 154 and 156 respectively, to provide the baseband output of the circuit. These amplifiers 150, 152, 154 and 156 provide additional gain, and, in this embodiment, are capable of swinging 1.5 volts peak to peak and driving a discrete all pole LC filter 160 with 100 ohms characteristic impedance. As an alternative, these filters may be integrated onto the integrated circuit 120, not as LC filters, but rather as active filters. Aside from eliminating the LC filter 160, active filters may be controlled so as, by way of example, to have cutoff frequencies in the range of 1 MHz to 45 MHz tunable by external means for the purpose of permitting variable data rate operations. Such an embodiment is shown in FIG. 3, wherein active filters 200 are incorporated as part of the integrated circuit 120 and have a bandpass control FILCTL for external control of the filters 200.

In a direct conversion to baseband at the frequencies encountered with the present invention, some DC offset will be generated by the down conversion as a result of local oscillator self-conversion. This results from the local oscillator frequency leaking into the RF signal input to the mixers 124 and 126, so that the local oscillator frequency will mix with itself, generating a difference frequency at DC. The level of the local oscillator signal in the RF signal input to the mixers 124 and 126 is approximately −50 dBm. The signal present may be as low as −70 dBm, so that if uncorrected, the DC offset may be as high as 20 dBm greater than the signal of interest. In order to avoid saturation of the amplifiers 150, 152 and 154, 156 on the output of the mixers 124 and 126, feedback of the DC offset is provided from the amplifier chains 150, 152 and 154, 156 to the output of the mixers 124 and 126, respectively, as shown in FIGS. 2 and 3. DC offset correction circuitry in general is well known, and need not be described in detail herein. Since the self-conversion may vary with frequency (channel selection), but otherwise will be substantially constant, and at most slowly drifting, the response of the DC offset correction circuitry may be slow, particularly in comparison to the typical data rates to be encountered.

Whether discrete filters or active filters are used, the output of the filters 200 will be digitized by analog-to-digital (A/D) converters 300 and then demodulated by the DSP 134 for recovery of the digital data. The A/D converters 300 may be, by way of example, MAX 1003/1004 A/D converters manufactured by Maxim Integrated Products, Inc., assignee of the present invention. With respect to the DSP 134 and the programming thereof for data recovery, various DSPs may be used and the programming thereof for demodulation and data recovery is well known in the data communications art, and accordingly need not be described in detail herein. In that regard, in the description of this embodiment, the DSP 134 is a special purpose processor, though a specially programmed but general purpose digital processor could be used. Accordingly, in the broad context, the DSP 134 is used to refer to any suitable processor for processing the digital signals at the required rate. In some cases, the dual A/D converters 300 may be included on the integrated circuit of the DSP 134.

Figure 1:
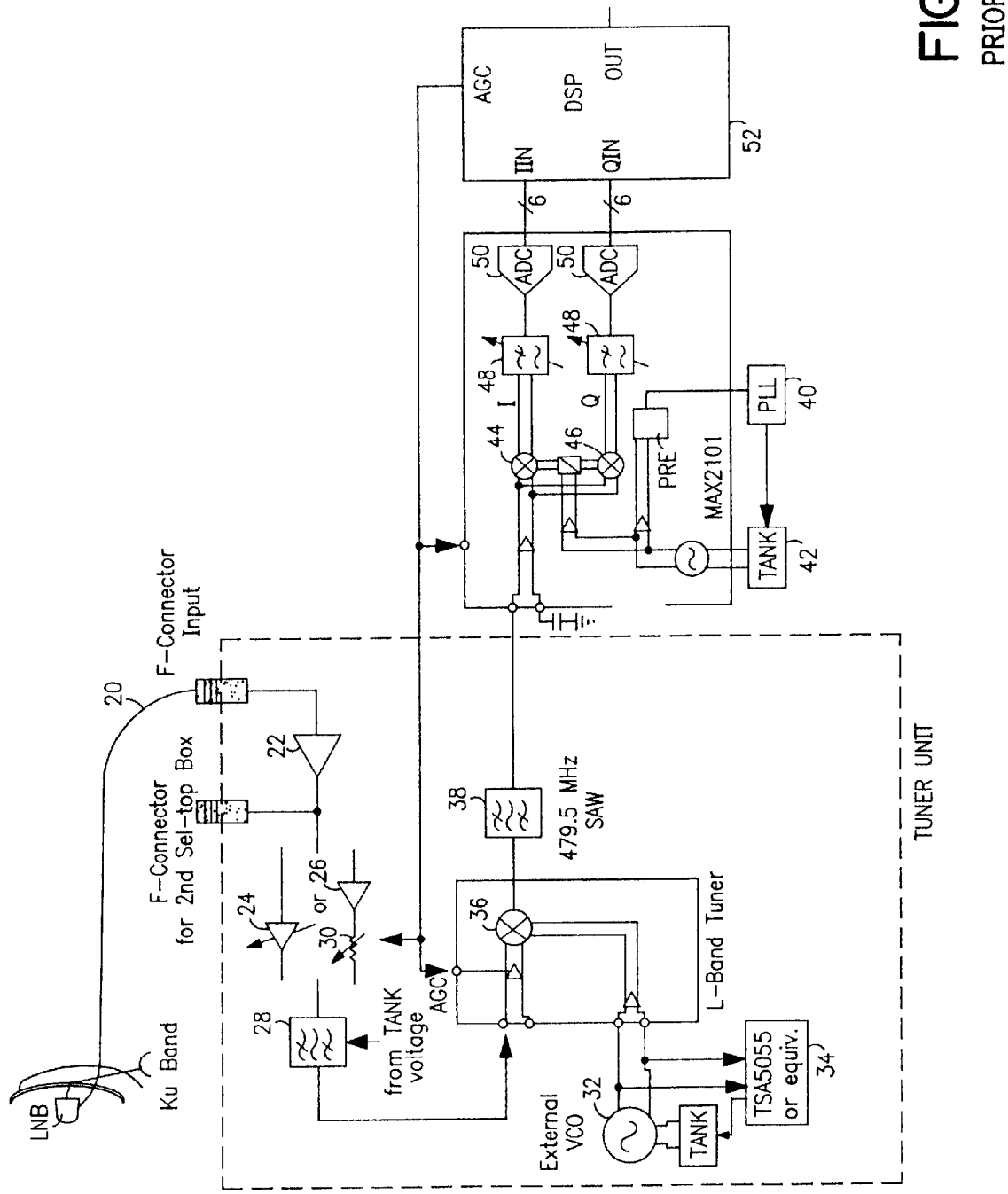
FIG. 1 is a block diagram for a representative prior art system for reception of a direct broadcast satellite (DBS) signal and extraction of the digital data in the signal.

In comparison with the prior art, the present invention allows elimination of a front end image filter 28, a second frequency conversion or mixer 36, a SAW filter 38, a VCO 32 and associated components typical of prior art designs as shown in FIG. 1. This provides cost and space saving, and simplifies the radio frequency design. The invention allows filtering of the unwanted adjacent channels to be performed in baseband as described, rather than by way of a SAW filter at an intermediate frequency typical of prior architectures. This enables the use of variable bandwidth active lowpass filtering to accommodate variable data rates, though of course as described, a fixed bandwidth low cost LC discrete filter may be used is desired.

Obviously, it is essential to the usefulness of the present invention that the I and Q components in the received signal be converted to digital form and provided to the DSP 134 for demodulation with the proper amplitude, in spite of normal variations in signal strength, be well matched in amplitude and be as close to 90° out of phase with each other as possible, and that the I and Q components, and thus the output of amplifier 122, have minimum intermodulation components in the output thereof so that the demodulation may proceed with minimum error consistent with the quality of the signal received by the satellite dish 100. The amplitude balance and the 90° phase shift between the I and Q components is of course determined primarily by the quadrature generator 148 and subsequent amplification, the characteristics of which for this embodiment have already been described. The extent to which the signal will be free of intermodulation components and will be controllable to be of the desired amplitude is determined primarily by amplifier 122. In this embodiment, this amplifier is a low noise, variable gain amplifier, with a gain range of 50 dB, adjustable by the feedback of an automatic gain control signal AGC (see FIGS. 2 and 3) in a range of 1 to 4 volts. This high range of variable gain is much greater than in prior part designs, but is necessary because of the variability in transponder power, dish alignment and 75 ohm cable length. In this embodiment, the amplifier 122 has an input IP3 of +5 dBm at a minimum gain setting. The excellent linearity eliminates the need for discrete varactor-tuned preselection filter, necessary in prior art designs to limit multiple carrier power from generating unwanted intermodulation and triple beat spurious signals in low noise amplifiers/mixers of lesser linearity. Amplifier 122 in this embodiment has a noise figure of 12 dB at maximum gain setting.

Figure 4:
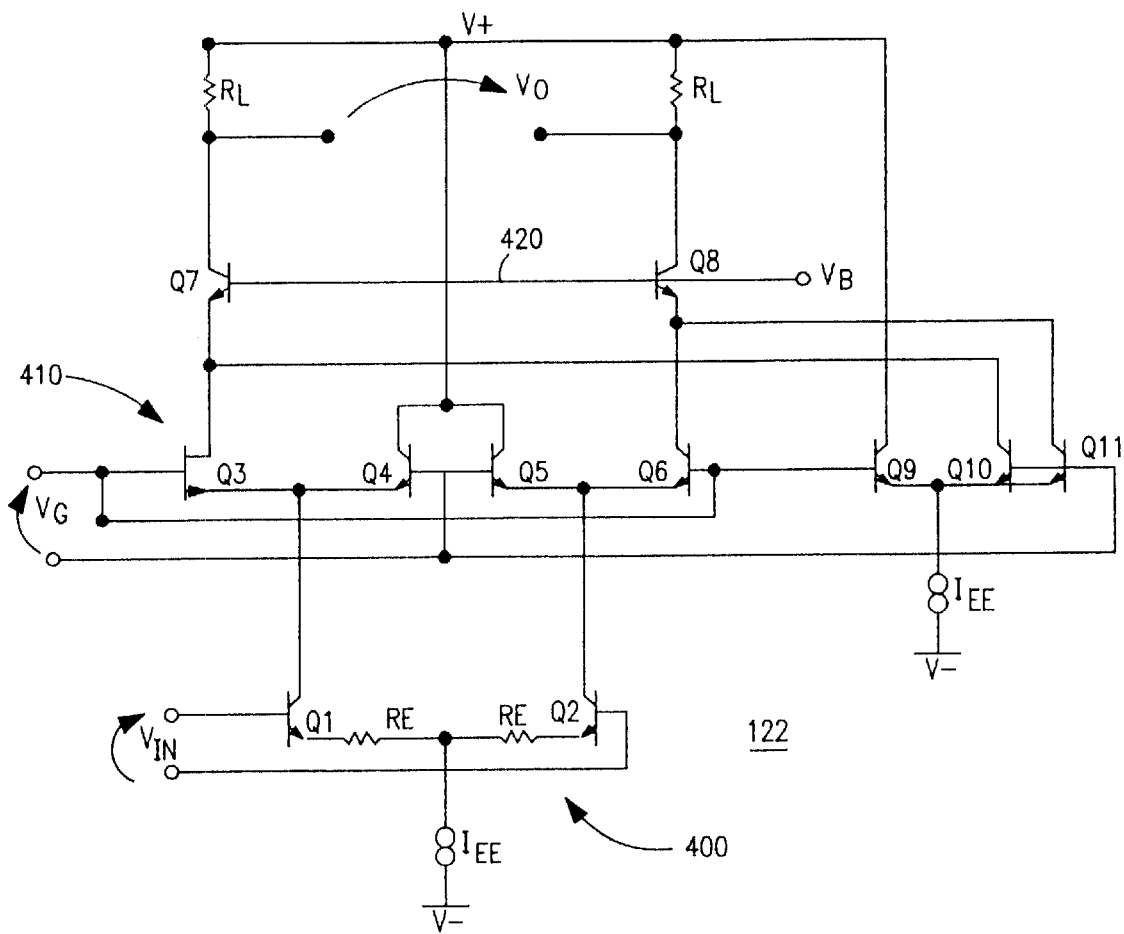
FIG. 4 is a circuit diagram for an exemplary circuit for the variable gain amplifier 122.

In order to achieve the high linearity (low intermodulation) through a wide automatic gain range desired for amplifier 122, a special AGC amplifier core is used. The basic circuit for the variable gain amplifier 122 is shown in FIG. 4. The amplifier 122 comprises (i) a $G_m$ (transconductance) stage 400 comprised of transistors Q1 and Q2, emitter resistors RE and a first current source IEE, (ii) a current steering stage 410 comprised of transistors Q3 through Q6, (iii) a common base 420 connected transistor pair Q7 and Q8, and (iv) controllable shunting current sources 430 comprising transistors Q9, Q10 and Q11 and another current source IEE adding additional emitter currents to the common base connected transistors Q7 and Q8 and resistors RL. Transistors Q7 and Q8 have their bases biased by a fixed bias voltage $V_B$.

The operation of the circuit of FIG. 4 will of course depend upon the relative transistor sizes. However, consider an example wherein transistors Q3, Q4, Q5, Q6, Q10 and Q11 are identical transistors, and transistor Q9 is twice the size of those identical transistors. Also, consider initially, a zero input voltage $V_{in}$ and a zero gain control voltage $V_g$. Because of the zero differential input voltage $V_{in}$, the current of the first current source $I_{ee}$ will divide equally between the collectors of transistors Q1 and Q2. These components, in turn, will further divide equally between transistors Q3 and Q4, and transistors Q5 and Q6, respectively, so that the collector currents in transistors Q3 and Q6 are each $I_{ee}/4$. With respect to transistors Q9, Q10 and Q11, the current source $I_{ee}$ will divide, with current $I_{ee}/4$ in transistors Q10 and Q11, and because transistor Q9 is twice the size of each of transistors Q10 and Q11, transistor Q9 will have a current $I_{ee}/2$.

Now, by way of example, if the gain control voltage $V_g$ is changed from zero to some value wherein the voltage on the bases of transistors Q3 and Q6 is less than the voltage on the bases of transistors Q4 and Q5, the gain of the amplifier will be reduced, and some of the bias current in transistors Q3 and Q6 will be shifted to transistors Q4 and Q5. At the same time, however, the change of the voltage of the bases of transistors Q3 and Q6 also lowers the base voltage of transistor Q9, reducing the bias current there through and increasing the bias current in transistors Q10 and Q11. The bias current increase in transistors Q10 and Q11 will equal the bias current decrease in transistors Q3 and Q6, so that the bias current in transistors Q7 and Q8 will remain substantially at $I_{ee}/2$, independent of the gain setting for the circuit. Thus, transistors Q7 and Q8 are substantially unaffected by the variation in gain, and more importantly, are not subject to the deleterious affects in circuit performance caused by operation at very low gain values. This substantially improves the linearity of the circuit and the gain control range, providing the low intermodulation and wide gain control range desired with the present invention. In this embodiment, such a VGA provides the majority of the adjustable gain range, with a subsequent stage of amplification supplementing the same to achieve the full range of approximately 50 dB. Of course, the specific amplifier circuit shown is by way of example only, as amplifiers of other designs may be used provided the gain control range is compatible with the required performance and the linearity is sufficient to assure data recovery with sufficient accuracy for the application.

Figure 5:
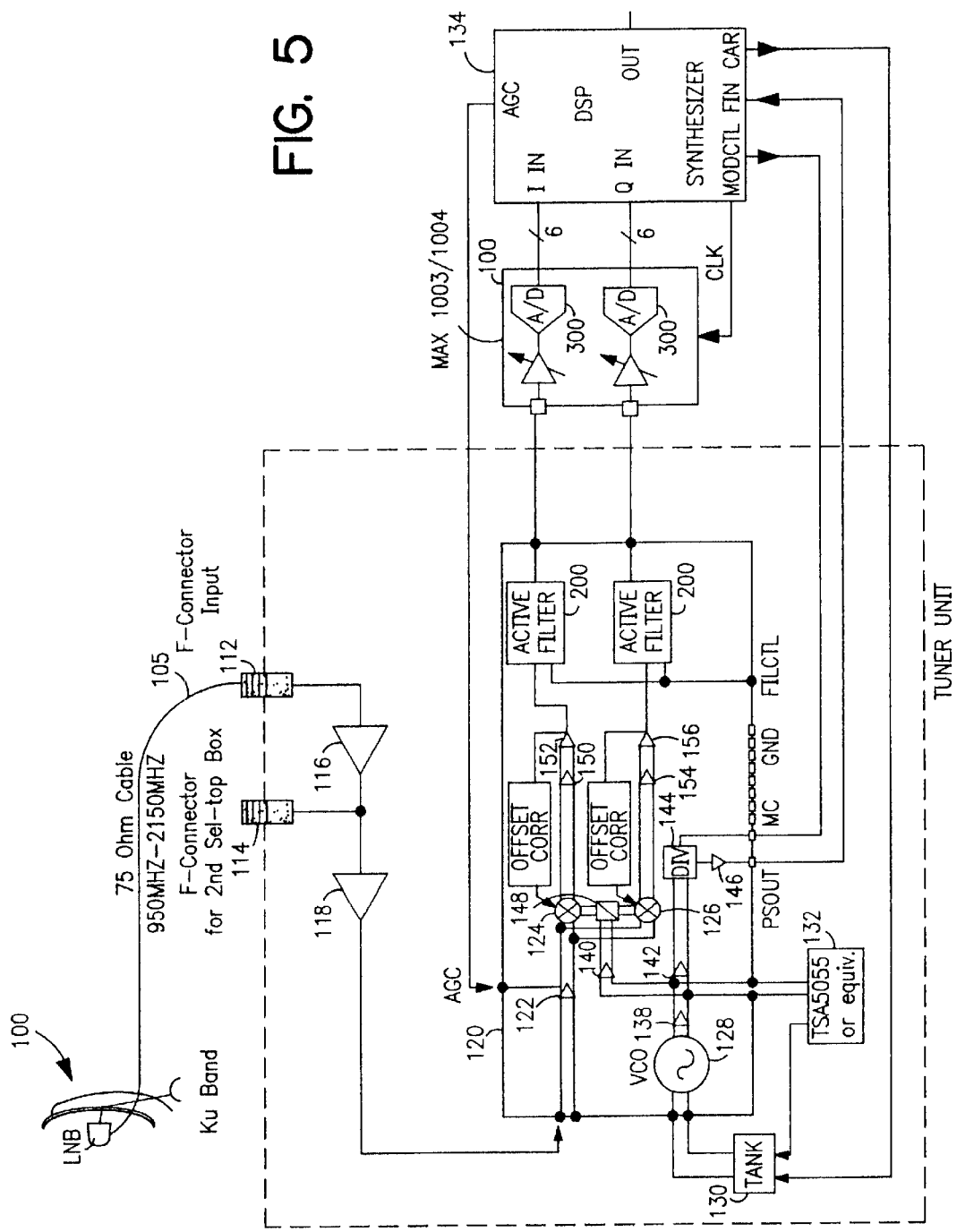
FIG. 5 is a further exemplary embodiment similar to FIG. 3 illustrating the incorporation of a voltage control oscillator (VCO) as part of the integrated circuit.
Figure 6:
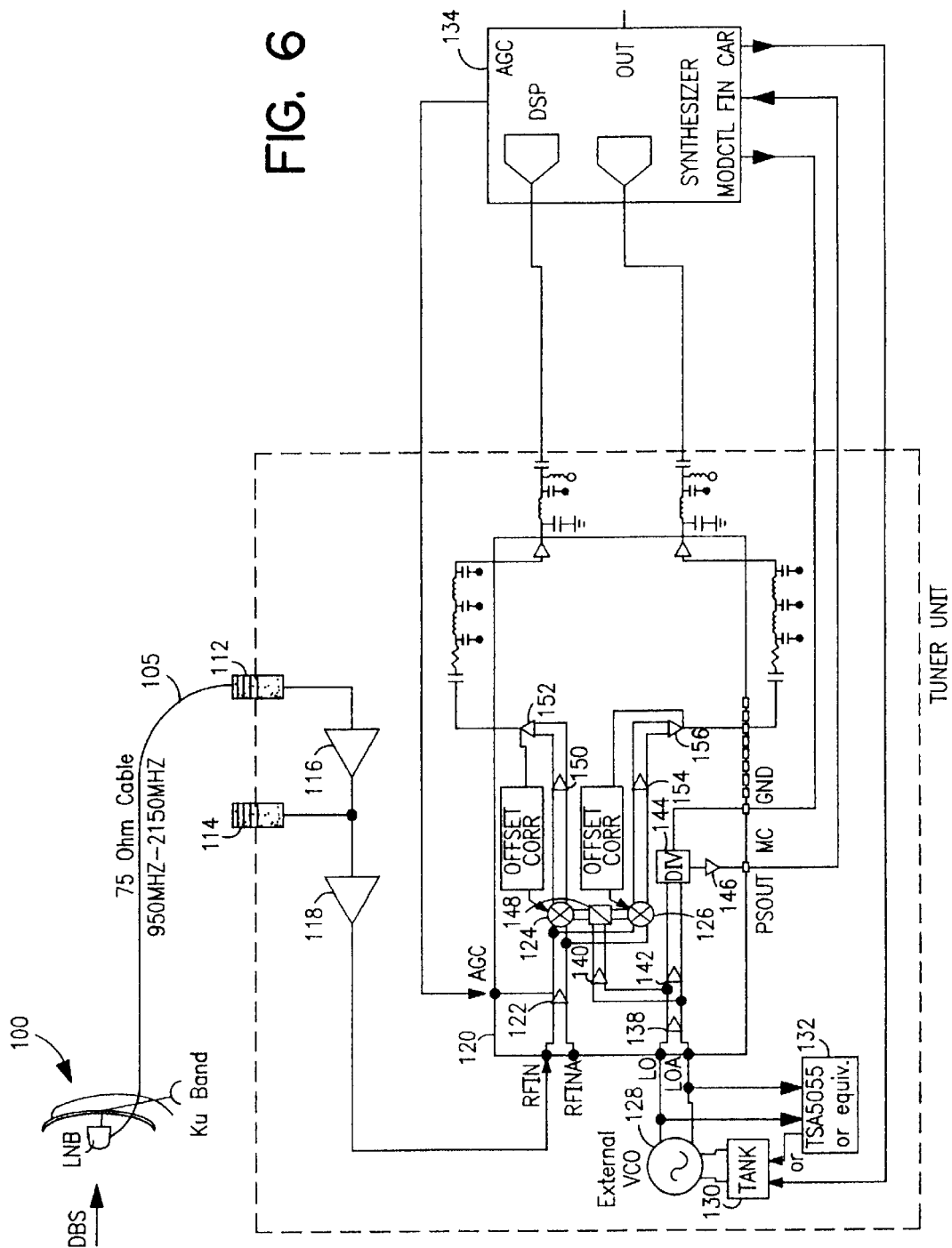
FIG. 6 is another exemplary embodiment similar to FIG. 2 illustrating the incorporation of post-filtering amplification as part of the integrated circuit.

In still other alternate embodiments, other functional elements may be included as part of the integrated circuit 120 as desired. By way of example, in the embodiment of FIG. 5, the VCO 128 has been incorporated into the integrated circuit 120. In the embodiment of FIG. 6, the filtering is done off-chip, though the post filtering amplification is incorporated into the integrated circuit 120. This embodiment better facilitates the use of conventional A/D converters, and further better facilitates the incorporation of the A/D converters onto the integrated circuit containing the DSP 134.

Figure 7:
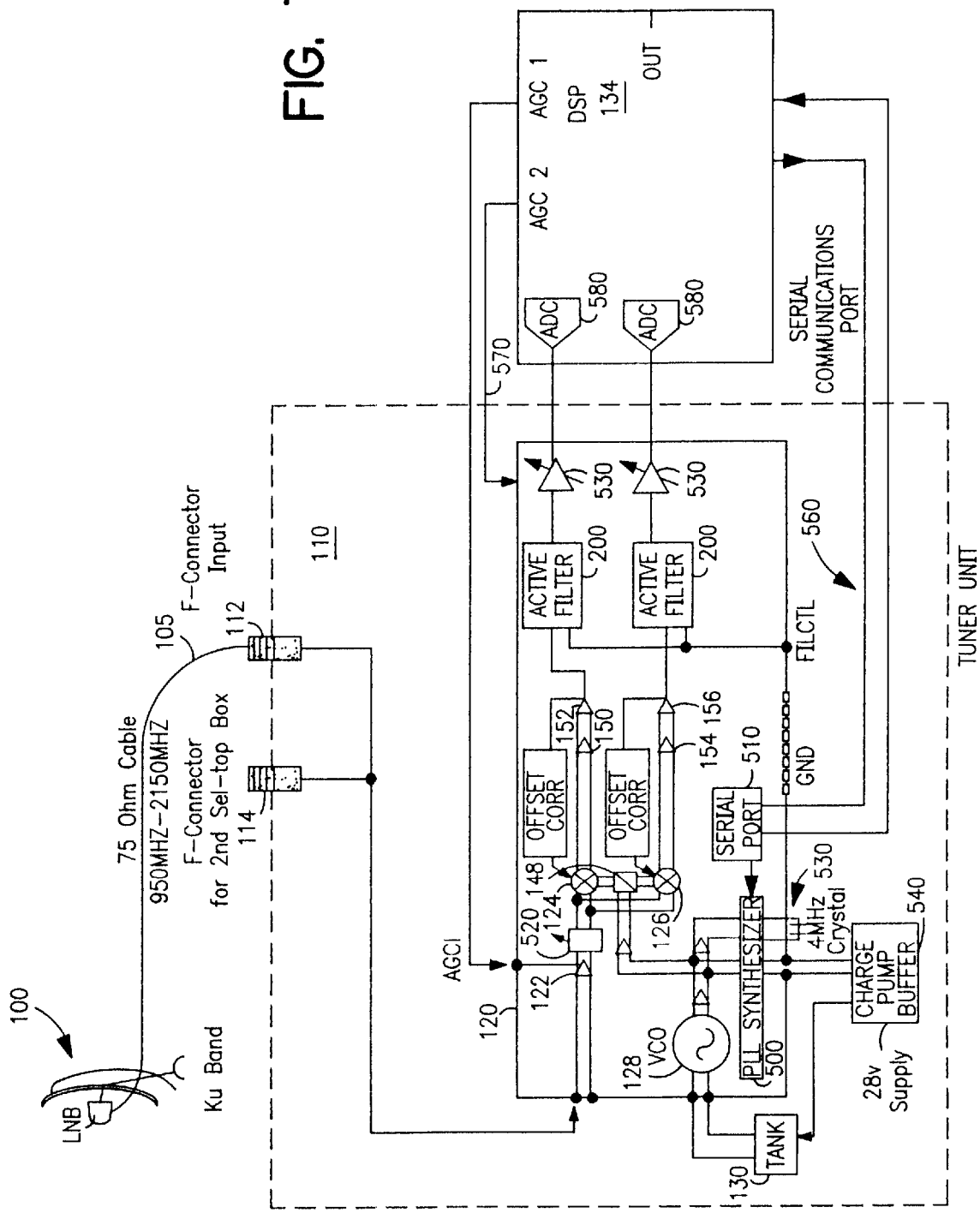
FIG. 7 is yet another exemplary embodiment similar to FIG. 3 illustrating the incorporation of a VCO, a frequency synthesizer, a front-end voltage gain amplifier (VGA) and a pair of VGAs at baseband for further refinement of gain control as part of the integrated circuit.

Additionally, in FIG. 7, an alternate embodiment of the present invention places other functional elements on the integrated circuit 120. Herein, VCO 128, a frequency (phase locked loop "PLL") synthesizer 500, a serial port 510, a bandpass (RF) filter 520 and a pair of VGAs 530 at baseband are employed in the integrated circuit 120. Coupled to a crystal oscillator 550 having a fixed reference frequency (e.g., approximately 4 megahertz "MHz"), the PLL synthesizer 500 controls an off-chip high voltage charge pump buffer 540 which, in turn, controls the tank circuit 130 to readjust and lock the output frequency of the VCO 128 to a desired frequency. The charge pump buffer 540 is required to protect the integrated circuit 120 from the high varactor voltage. This is accomplished by feeding back the output frequency of the VCO 128 and comparing the output frequency to a PLL synthesized frequency. The PLL synthesized frequency is a submultiple of the fixed reference frequency from crystal oscillator 550. The reference frequency is divided by an internal divider which may be programmable. The factor is a whole number, being programmed by the DSP 134 via the serial port 510 and two or more serial communication lines 560.

The pair of VGAs 530 are controlled by the DSP 134, in conjunction with front-end VGA 122, through a second automatic gain control (AGC2) signal over signal line 570. The VGAs 530 provide variable gain to adjust the analog signal levels needed by the A/D converters 580 in the DSP 134. The DSP 134 provides a digital output signal through an OUT terminal.

Also, front-end VGA 122 is coupled to the lowpass filter 520. The addition of the lowpass filter 520 eliminates unwanted signals at the output of front-end VGA 122 from being down converted due to spurious signals generated by the VCO 128. For example, these spurious signals could be the second harmonic of the output frequency from the VCO 128, although other spurious signals may exist. The filter may be bypassed, under programmable control, or the frequency shifted, to allow the proper desired carrier to be downconverted without attenuation. This improved linearity eliminates the need for at least amplifier 118 of FIG. 2 and perhaps amplifier 116 as well. The bandpass filter 520 may be switched ON or OFF, depending on the frequency of the desired RF carrier, or tuned electronically by known methods.

Thus, while the present invention has been disclosed and described with respect to certain preferred embodiments thereof, it will be understood by those skilled in the art that the present invention may be varied without departing from the spirit and scope thereof.

What is claimed is:

1. An integrated circuit comprising:
   a variable gain amplifier (VGA) having an amplifier input to receive an input signal including a frequency corresponding to a direct broadcast satellite signal frequency range and a gain control input to receive a gain control signal, the amplifier providing a VGA output at a level controlled by the gain control signal;
   a frequency synthesizer to regulate an oscillator signal to desired frequency using a fixed reference frequency;
   a quadrature generator coupled to the variable gain amplifier and the frequency synthesizer, the quadrature generator to receive the oscillator signal and to generate inphase and quadrature components thereof; and
   a plurality of mixers coupled to the quadrature generator, the plurality of mixers to mix the VGA output with the inphase and quadrature components from the quadrature generator to provide inphase and quadrature components of the VGA output.

2. The integrated circuit of claim 1 further comprising a terminal coupled to the gain control input, the terminal to receive the gain control signal from a source off the integrated circuit.

3. The integrated circuit of claim 1 further comprising an amplifier coupled to each of the plurality of mixers, the amplifiers to amplify the inphase and the quadrature components of the VGA output from the plurality of mixers.

4. The integrated circuit of claim 3 further comprising a plurality of low pass active filters coupled to the amplifiers coupled to the plurality of mixers.

5. The integrated circuit of claim 4, wherein a low pass range of the active filters is adjustable.

6. The integrated circuit of claim 1 further comprising
   a plurality of serial communication lines; and
   a serial port coupled to the plurality of serial communication lines and the frequency synthesizer, the serial port being used to program the frequency synthesizer to produce the desired frequency.

7. The integrated circuit of claim 1 further comprising a plurality of variable gain amplifiers to provide variable gain in order to adjust the VGA output before being output from the integrated circuit.

8. The integrated circuit of claim 7, wherein the plurality of variable gain amplifiers are controlled in conjunction with the variable gain amplifier.

9. The integrated circuit of claim 1 further comprising a broadband filter coupled to both the VGA and the plurality of mixers.

10. The integrated circuit of claim 9, wherein the broadband filter is switched on and off, depending on a frequency of the desired RF carrier.

11. The integrated circuit of claim 9, wherein the broadband filter is tuned electronically.

12. A tuner and data recovery system comprising:
    a digital signal processor; and
    an integrated circuit coupled to the digital signal processor, the integrated circuit including
       a variable gain amplifier (VGA) including (i) an amplifier input to receive a direct broadcast satellite signal, and (ii) a gain control input to receive a gain control signal, the variable gain amplifier providing as a VGA output at a level controlled by the gain control signal;
       a frequency synthesizer to regulate an oscillator signal to a desired frequency using a fixed reference frequency;
       a quadrature generator coupled to the variable gain amplifier and the frequency synthesizer, the quadrature generator to receive the oscillator signal and to generate inphase and quadrature components thereof; and
       a plurality of mixers coupled to the quadrature generator, the plurality of mixers to mix the VGA output with the inphase and quadrature components from the quadrature generator to provide inphase and quadrature components of the VGA output.

13. The tuner and data recovery system of claim 12 wherein the digital signal processor providing the gain control signal to the integrated circuit.

14. The tuner and data recovery system of claim 12, wherein the integrated circuit further includes at least one amplifier coupled to each of the plurality of mixers, the at least one amplifier to amplify the inphase and the quadrature components of the VGA output from the plurality of mixers.

15. The tuner and data recovery system of claim 12, wherein the integrated circuit further includes a filter coupled to each of the at least one amplifier.

16. The tuner and data recovery system of claim 15, wherein a pass range of each filter is adjustable.

17. The tuner and data recovery system of claim 12, wherein the integrated circuit further includes a serial port coupled the plurality of serial communication lines and the frequency synthesizer, the serial port being used to program the frequency synthesizer to produce the desired frequency.

18. The tuner and data recovery system of claim 12, further comprising a plurality of variable gain amplifiers to provide variable gain to adjust the VGA output.

19. The tuner and data recovery system of claim 18, wherein the digital signal processor is programmed to provide the gain control signal to the variable gain amplifier and the plurality of variable gain amplifiers.

20. The tuner and data recovery system of claim 12, wherein the frequency synthesizer comprises a phase locked loop (PLL) synthesizer.

21. A tuner comprising:
a tank circuit; and
an integrated circuit coupled to the tank circuit, the integrated circuit including
a voltage controlled oscillator to provide an oscillator signal;
a variable gain amplifier including (i) an amplifier input to receive a direct broadcast satellite signal, and (ii) a gain control input to receive a gain control signal, the variable gain amplifier providing, as a VGA output at a level controlled by the gain control signal;
a frequency synthesizer to control the tank circuit in order to regulate the oscillator signal to a desired frequency using a fixed reference frequency;
a quadrature generator coupled to the VGA and the frequency synthesizer, the quadrature generator to receive the oscillator signal and to generate inphase and quadrature components thereof; and
a plurality of mixers coupled to the quadrature generator, the plurality of mixers to mix the VGA output with the inphase and quadrature components from the quadrature generator to provide inphase and quadrature components of the VGA output.

22. The tuner of claim 21, wherein the integrated circuit further comprising at least one amplifier coupled to each of the plurality of mixers to amplify the inphase and the quadrature components of the VGA output.

23. The tuner of claim 22, wherein the integrated circuit further comprising at least one filter coupled between each of the plurality of mixers and the at least one amplifier.

24. The tuner of claim 23, further comprising a digital signal processor to control the variable gain amplifier and the at least one amplifier associated with each of the plurality of mixers.

25. The tuner of claim 21, wherein the integrated circuit further comprising a filter coupled between the variable gain amplifier and the plurality of mixers.

* * * * *